US010339983B1

(12) United States Patent
Confalonieri et al.

(10) Patent No.: US 10,339,983 B1
(45) Date of Patent: Jul. 2, 2019

(54) TEMPERATURE-BASED MEMORY OPERATIONS

(71) Applicant: Micron Technology, Inc., Boise, ID (US)

(72) Inventors: Emanuele Confalonieri, Lesmo (IT); Stefano Ratti, San Donato Milanese (IT); Gary G. Lazarowics, North Lanarkshire (GB); Stefan Frederik Schippers, Peschiera del Garda (IT); Stefano Claudio Roseghini, Saronno (IT); Angelo Clemente Scardilla, Tremestieri Etneo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/857,704

(22) Filed: Dec. 29, 2017

(51) Int. Cl.
| | |
|---|---|
| *G11C 16/26* | (2006.01) |
| *G11C 7/04* | (2006.01) |
| *G01K 3/00* | (2006.01) |
| *G11C 13/00* | (2006.01) |
| *G06F 3/06* | (2006.01) |
| *G11C 16/34* | (2006.01) |

(52) U.S. Cl.
CPC ............... *G11C 7/04* (2013.01); *G01K 3/005* (2013.01); *G06F 3/064* (2013.01); *G06F 3/0679* (2013.01); *G11C 13/0033* (2013.01); *G11C 16/26* (2013.01); *G11C 16/3431* (2013.01); *G06F 3/0616* (2013.01); *G11C 2211/562* (2013.01); *G11C 2211/5641* (2013.01)

(58) Field of Classification Search
CPC .............. G11C 2211/5641; G11C 2211/562
USPC ........................................ 365/185.03
See application file for complete search history.

(56) References Cited

U.S. PATENT DOCUMENTS

| | | | | |
|---|---|---|---|---|
| 8,027,194 B2* | 9/2011 | Lee | ............... | G11C 11/5628 365/185.03 |
| 8,472,274 B2* | 6/2013 | Fai | ............... | G11C 11/5642 365/185.09 |
| 8,873,323 B2* | 10/2014 | Li | ............... | G06F 12/0246 365/185.11 |
| 9,141,528 B2* | 9/2015 | Gorobets | ............ | G06F 12/0246 |

(Continued)

FOREIGN PATENT DOCUMENTS

| | | |
|---|---|---|
| JP | 2006-286149 A | 10/2006 |
| KR | 10-2013-0072712 A | 7/2013 |

OTHER PUBLICATIONS

Olson "NAND Flash Memory Reliability in Embedded Computer Systems", Schweitzer Engineering Laboratories, Inc., Pullman WA, Dec. 11, 2014, 8 pp.

(Continued)

*Primary Examiner* — Son L Mai
(74) *Attorney, Agent, or Firm* — Brooks, Cameron & Huebsch, PLLC

(57) ABSTRACT

Apparatuses, methods, and devices that can be utilized to provide temperature-based memory operations are described. One or more apparatuses can include a memory device and a controller coupled to the memory device and configured to: determine an operating temperature of the apparatus, determine one of a plurality of designated open blocks of the memory device to write data based on the operating temperature of the apparatus and a size of the data, and write the data in the determined one of the plurality of designated blocks of the memory device.

23 Claims, 3 Drawing Sheets

(56) References Cited

U.S. PATENT DOCUMENTS

| | | | |
|---|---|---|---|
| 9,176,864 B2* | 11/2015 | Gorobets | G06F 12/0246 |
| 9,990,964 B1* | 6/2018 | Lee | G11C 7/04 |
| 9,996,281 B2* | 6/2018 | Sharon | G06F 3/0619 |
| 2010/0174876 A1 | 7/2010 | Kasahara et al. | |
| 2012/0224425 A1 | 9/2012 | Fai et al. | |
| 2015/0301932 A1* | 10/2015 | Oh | G06F 11/00 |
| | | | 711/102 |
| 2016/0117216 A1 | 4/2016 | Muchherla et al. | |
| 2016/0139812 A1 | 5/2016 | Zhang | |
| 2016/0335012 A1 | 11/2016 | Maheshwari | |
| 2017/0032836 A1* | 2/2017 | Kimura | G11C 7/04 |
| 2017/0053714 A1 | 2/2017 | Guy et al. | |
| 2017/0060425 A1* | 3/2017 | Sunata | G06F 3/064 |
| 2017/0262198 A1* | 9/2017 | Nakata | G06F 3/0619 |

OTHER PUBLICATIONS

"SLC vs. MLC: An Analysis of Flash Memory", Super Talent Technology, Inc., San Jose, California, Jul. 7, 2016, 9 pp.
International Search Report and Written Opinion from related international application No. PCT/US2018/063952, dated Mar. 15, 2019, 13 pp.

* cited by examiner

TEMPERATURE-BASED MEMORY OPERATIONS

TECHNICAL FIELD

The present disclosure relates generally to semiconductor memory devices and methods and, more particularly, to apparatuses and methods that can be utilized to provide temperature-based memory operations.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others. Memory can comprise memory cells programmable as single level cells (SLCs) and/or multi-level cells (MLCs).

Memory used for some applications (e.g., automotive, aeronautic, or surveillance) can have variable operating temperatures. These variable operating temperatures may include a wide range of temperatures. Some memory (e.g., NAND flash memory) can be temperature sensitive such that temperature variations may affect data reliability. For example, writing data at a first temperature and then reading the data at a second temperature, which is different than the first temperature, can result in an increased raw bit error rate (RBER), as compared to writing data and then reading the data at a same temperature.

DETAILED DESCRIPTION

Figure 1:
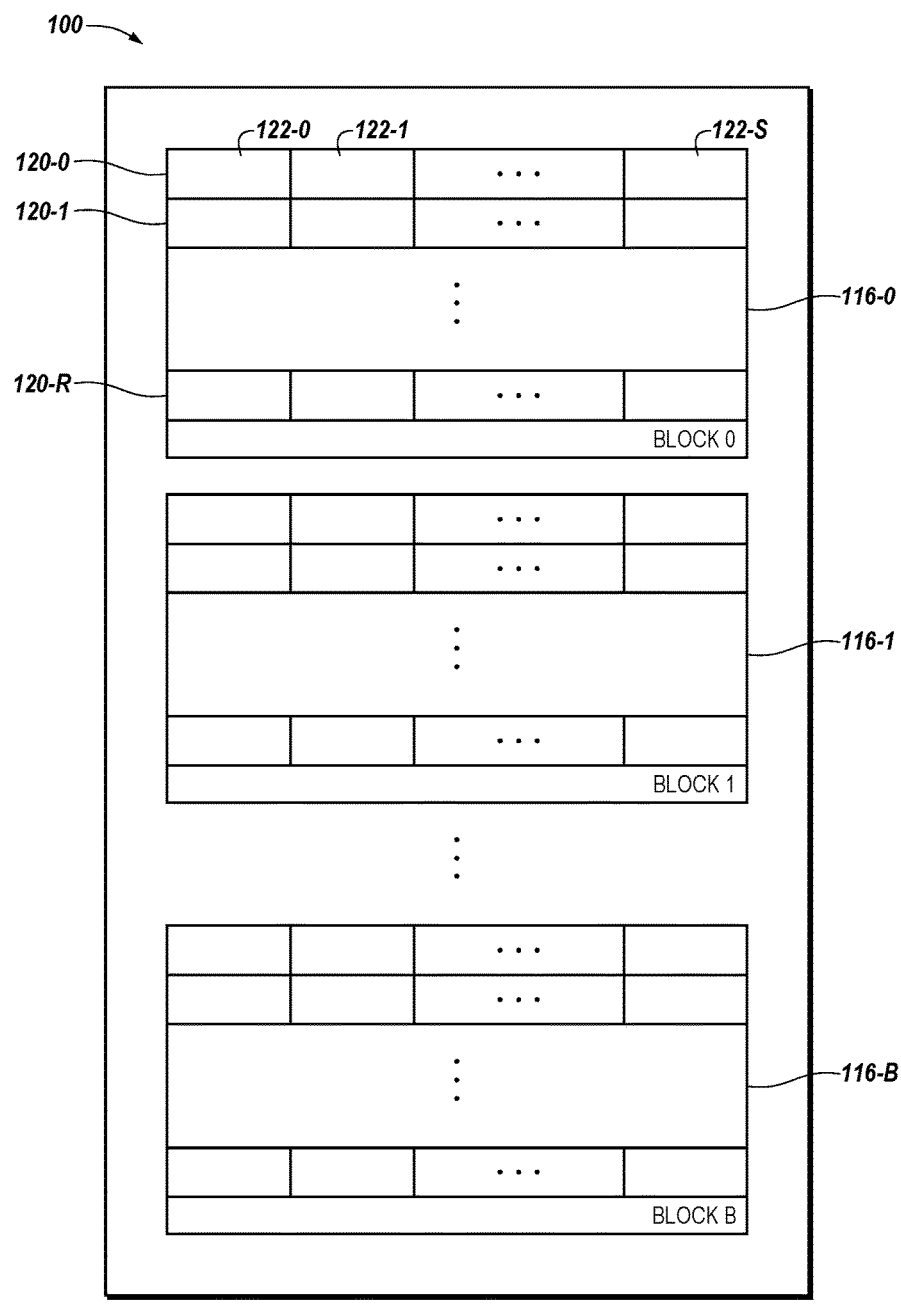
FIG. 1 is a block diagram of a portion of a memory device in accordance with one or more embodiments of the present disclosure.

Memory devices can be combined together to form solid state drives (SSDs), embedded MultiMediaCard (eMMC) devices, and/or Universal Flash Storage (UFS) devices, among various other storage devices. For example, such devices may include a number of memory chips, which can include a number of dies and/or logical units (LUNs). Each die can include a number of memory arrays and peripheral circuitry thereon. The memory arrays can include a number of memory cells organized into a number of physical pages, and the physical pages can be organized into a number of blocks.

The present disclosure includes apparatuses and methods that can be utilized to provide temperature-based memory operations. As an example, an apparatus can include a memory device and a controller coupled to the memory device and configured to determine an operating temperature of the apparatus, determine one of a plurality of designated open blocks of the memory device to write data based on the operating temperature of the apparatus, and write the data in the determined one of the plurality of designated blocks of the memory device.

As previously discussed, memory (e.g., eMMCs, UFS, SSDs, etc.) used for some applications can have variable operating temperatures. For instance, applications having variable operating temperatures can include automotive, aeronautic, and surveillance, among other applications. These variable operating temperatures may include a wide range of temperatures. For example, the variable operating temperatures of a memory device may be from −40 degrees Celsius to 125 degrees Celsius, among other operating temperatures. NAND flash memory can be temperature sensitive. For example, in NAND flash memory, writing data at a first temperature and then reading the data at a second temperature, which is different than the first temperature, can result in an increased raw bit error rate (RBER), as compared to writing data and then reading the data at a same temperature.

Some previous approaches have utilized temperature compensation schemes (e.g., built in temperature compensation schemes). Built in temperature compensation schemes are utilized to adjust read voltages based upon an immediate temperature of the NAND. However, the voltage shifts that are experienced by the NAND flash memory may not correlate with an internal read voltage adjustment, particularly in an extreme cross-temperature condition, such as encountered in automotive applications, for instance. As such, under an extreme cross-temperature condition, the NAND flash memory may experience a voltage distribution shift relative to a read voltage position that results in an increased RBER. Moreover, in multilevel cell contexts, the impact of a voltage distribution shift on RBER may be further increased.

An increase in RBER can result in correctable errors with an increased amount of failing bits and/or uncorrectable errors. Correctable errors with an increased amount of failing bits and/or uncorrectable errors can result in error handling and/or data refresh activity, both of which can lead to a performance reduction. Additionally, an increase in RBER can result in an increased write amplification, which can reduce an expected useful lifetime of the NAND flash memory. Embodiments of the present disclosure can provide benefits such as a reduced RBER, as compared to previous approaches.

Multi-level cell (MLC) storage provides increased storage density compared to single-level cell (SLC) storage. However, embodiments herein can leverage the reliability offered by SLC storage, especially at varying temperatures. As previously discussed, automotive applications, which include infotainment systems, instrument cluster systems, and black box data recording systems, for example, experience variable operating temperatures. Embodiments of the present disclosure can take the operating temperature into account and select a write strategy accordingly.

For example, some embodiments can include tracking the write temperature and identifying a plurality of temperature ranges. It is noted that while three temperature ranges are sometimes discussed herein, it is to be understood that such discussion is not to be taken in a limiting sense; other quantities of operating ranges are in accordance with the present disclosure. In the example of three temperature ranges, the three temperature ranges can be labeled low T, mid T, and high T. At low T and high T, embodiments herein may write data (e.g., host data) only in SLC. At mid T, embodiments herein may write data in either SLC or MLC, depending on factors such as the size of the data, for instance. Also in mid T, embodiments herein can perform folding operations and/or garbage collection operations in which SLC data is rewritten to MLC data. Stated differently, when either low temperatures or high temperatures return to medium temperatures, previously-written SLC data can be converted to MLC data. Embodiments in accordance with the present disclosure can therefore take advantage of the reliability of SLC in low and high temperatures, and also take advantage of the increased storage ability provided by MLC.

Embodiments of the present disclosure can extend the temperature ranges of memory devices to those encountered in automotive contexts. For example, in some embodiments, memory operations can be performed between −40 degrees Celsius and 125 degrees Celsius. Embodiments herein can provide benefits such as increased device reliability (e.g., decreased errors) as compared to previous approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N", "M", and "X" particularly with respect to reference numerals in the drawings, indicate that a number of the particular feature so designated can be included with one or more embodiments of the present disclosure. Additionally, as used herein, "a number of" something can refer to one or more such things. For example, a number of memory devices can refer to one or more memory devices.

The figures herein follow a numbering convention in which the first digit corresponds to the drawing figure number and the remaining digits identify an element or component in the drawing. Similar elements or components between different figures may be identified by the use of similar digits. For example, 120 may reference element "20" in FIG. 1, and a similar element may be referenced as 220 in FIG. 2. As will be appreciated, elements shown in the various embodiments herein can be added, exchanged, and/or eliminated so as to provide a number of additional embodiments of the present disclosure. In addition, as will be appreciated, the proportion and/or the relative scale of the elements provided in the figures are intended to illustrate the embodiments of the present invention and should not be taken in a limiting sense.

FIG. 1 illustrates a diagram of a portion of a memory array 100 having a number of physical blocks in accordance with a number of embodiments of the present disclosure. Memory array 100 can be, for example, a NAND flash memory array. However, embodiments of the present disclosure are not limited to a particular type of memory or memory array. For example, memory array 100 can be an RRAM array, a PCRAM array, or an array utilizing 3D cross-point technology, among other types of memory arrays. Further, although not shown in FIG. 1, memory array 100 can be located on a particular semiconductor die along with various peripheral circuitry associated with the operation thereof.

As shown in FIG. 1, memory array 100 has a number of physical blocks 116-0 (BLOCK 0), 116-1 (BLOCK 1), . . . , 116-B (BLOCK B) of memory cells. The memory cells can be single level cells (SLCs), which store a single bit per cell, and/or multi-level cells (MLCs), which can store more than a single bit per cell, with each cell being programmable to more than two distinct states. For instance, MLCs can include three bit cells (TLCs) programmable to eight distinct cell states or quadruple bit cells (QLCs) programmable to sixteen distinct cell states. As used herein, the term MLC may be used to refer generally to multilevel cells such as two bit cells, three bit cells, four bit cells, etc. The number of physical blocks in memory array 100 may be 128 blocks, 512 blocks, or 1,024 blocks, but embodiments are not limited to a particular multiple of 128 or to any particular number of physical blocks in memory array 100. A first number of blocks 116-0, 116-1, . . . , 116-B can be allocated as a first portion or pool of memory blocks, a second number of blocks 116-0, 116-1, . . . , 116-B can be allocated as a second portion or pool of memory blocks, and/or a third number of blocks 116-0, 116-1, . . . , 116-B can be allocated as a third portion or pool of memory blocks.

A number of physical blocks of memory cells (e.g., blocks 116-0, 116-1, . . . , 116-B) can be included in a plane of memory cells, and a number of planes of memory cells can be included on a die. For instance, in the example shown in FIG. 1, each physical block 116-0, 116-1, . . . , 116-B can be part of a single die. That is, the portion of memory array 100 illustrated in FIG. 1 can be die of memory cells.

As shown in FIG. 1, each physical block 116-0, 116-1, . . . , 116-B contains a number of physical rows (e.g., 120-0, 120-1, . . . , 120-R) of memory cells coupled to access lines (e.g., word lines). The number of rows (e.g., word lines) in each physical block can be 32, but embodiments are not limited to a particular number of rows 120-0, 120-1, . . . , 120-R per physical block. Further, although not shown in FIG. 1, the memory cells can be coupled to sense lines (e.g., data lines and/or digit lines).

Each row 120-0, 120-1, . . . , 120-R can include a number of pages of memory cells (e.g., physical pages). A physical page refers to a unit of programming and/or sensing (e.g., a number of memory cells that are programmed and/or sensed together as a functional group). In the embodiment shown in FIG. 1, each row 120-0, 120-1, . . . , 120-R comprises one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including MLCs, a physical page of memory cells can store multiple pages (e.g., logical pages) of data, for example, an upper page of data and a lower page of data, with each cell in a physical page storing one or more bits towards an upper page of data and one or more bits towards a lower page of data.

A program operation (e.g., a write operation) can include applying a number of program pulses (e.g., 16V-20V) to a selected word line in order to increase the threshold voltage (Vt) of the selected cells coupled to that selected word line to a desired program voltage level corresponding to a target (e.g., desired) data state. A sense operation, such as a read or program verify operation, can include sensing a voltage and/or current change of a sense line coupled to a selected cell in order to determine the data state of the selected cell.

In a number of embodiments of the present disclosure, and as shown in FIG. 1, a page of memory cells can comprise a number of physical sectors 122-0, 122-1, . . . , 122-S (e.g., subsets of memory cells). Each physical sector 122-0, 122-1, . . . , 122-S of cells can store a number of logical sectors of data (e.g., data words). Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 122-0, 122-1, . . . , 122-S, can store system and/or user data, and/or can include overhead data, such as error correction code (ECC) data, logical block address (LBA) data, and recurring error data.

Logical block addressing is a scheme that can be used by a host for identifying a logical sector of data. For example, each logical sector can correspond to a unique logical block address (LBA). Additionally, an LBA may also correspond to a physical address. A logical sector of data can be a number of bytes of data (e.g., 256 bytes, 512 bytes, or 1,024 bytes). However, embodiments are not limited to these examples.

It is noted that other configurations for the physical blocks 116-0, 116-1, . . . , 116-B, rows 120-0, 120-1, . . . , 120-R, sectors 122-0, 122-1, . . . , 122-S, and pages are possible. For example, rows 120-0, 120-1, . . . , 120-R of physical blocks 116-0, 116-1, . . . , 116-B can each store data corresponding to a single logical sector which can include, for example, more or less than 4096 bytes of data.

Figure 2:
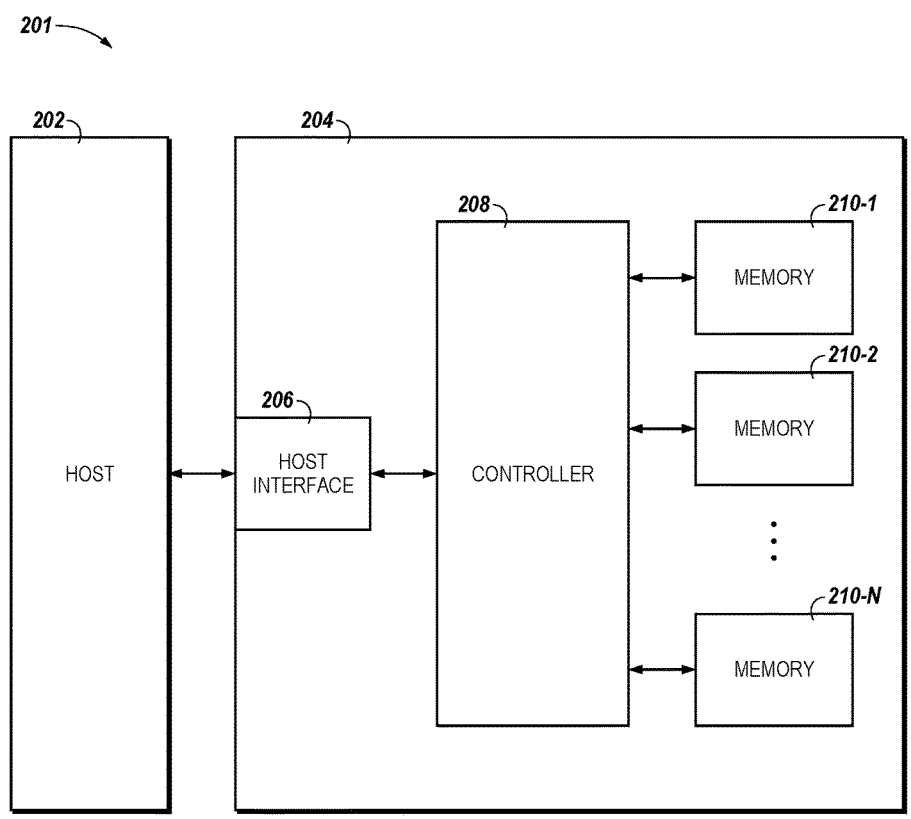
FIG. 2 is a functional block diagram of an apparatus in the form of a computing system including at least one memory system in accordance with one or more embodiments of the present disclosure.

FIG. 2 is a functional block diagram of an apparatus in the form of a computing system 201 comprising a memory system 204 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

Memory system 204 can be, for example, an eMMC device, a UFS device, or a SSD. In the embodiment illustrated in FIG. 2, memory system 204 includes a host interface 206, a memory (e.g., a number of memory devices 210-1, 210-2, . . . , 210-N), and a controller 208 coupled to physical host interface 206 and memory devices 210-1, 210-2, . . . , 210-N.

Memory devices 210-1, 210-2, . . . , 210-N can include, for example, a number of non-volatile memory arrays (e.g., arrays of non-volatile memory cells). For instance, memory devices 210-1, 210-2, . . . , 210-N can include a number of memory arrays analogous to memory array 100 previously described in connection with FIG. 1.

In some embodiments, the memory devices 210-1, . . . , 210-N can include a number of arrays of memory cells (e.g., non-volatile memory cells). The arrays can be flash arrays with a NAND architecture, for example. However, embodiments are not limited to a particular type of memory array or array architecture. As described above in connection with FIG. 1, the memory cells can be grouped, for instance, into a number of blocks including a number of physical pages of memory cells. In a number of embodiments, a block refers to a group of memory cells that are erased together as a unit. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. As another example, a memory device may be configured to store 16 KB of user data per page, 512 pages of user data per block, 544 blocks per plane, and 2 planes per device.

In operation, data can be written to and/or read from a memory device of a memory system (e.g., memory devices 210-1, . . . , 210-N of memory system 204) as a page of data, for example. As such, a page of data can be referred to as a data transfer size of the memory system. Data can be transferred to/from a host 202) in data segments referred to as sectors (e.g., host sectors). As such, a sector of data can be referred to as a data transfer size of the host. In some embodiments, NAND blocks may be referred to as erase blocks, with blocks being a unit of erasure and pages being a measure of reads and/or writes.

Host interface 206 can be used to communicate information between memory system 204 and another device such as a host 202. Host 202 can include a memory access device (e.g., a processor). As used herein, "a processor" can intend a number of processors, such as a parallel processing system, a number of coprocessors, etc. Example hosts can include personal laptop computers, desktop computers, digital cameras, digital recording and playback devices, mobile (e.g., smart) phones, PDAs, memory card readers, interface hubs, and the like.

Host interface 206 can be in the form of a standardized physical interface compliant with a suitable protocol and/or specification. For example, when memory system 204 is used for information storage in computing system 201, host interface 206 can be an eMMC interface, a UFS interface, a serial advanced technology attachment (SATA) interface, a peripheral component interconnect express (PCIe) interface, or a universal serial bus (USB) interface, among other interface types. In general, however, host interface 206 can provide an interface for passing control, address, information (e.g., data), and other signals between memory system 204 and a host (e.g., host 202) having compatible receptors for host interface 206.

Controller 208 can include, for example, control circuitry and/or logic (e.g., hardware and firmware). Controller 208 can be included on the same physical device (e.g., the same die) as memories 210-1, 210-2, . . . , 210-N. For example, controller 208 can be an application specific integrated circuit (ASIC) coupled to a printed circuit board including physical host interface 206 and memories 210-1, 210-2, . . . , 210-N. Alternatively, controller 208 can be included on a separate physical device that is communicatively coupled to the physical device that includes memories 210-1, 210-2, . . . , 210-N. In a number of embodiments, components of controller 208 can be spread across multiple physical devices (e.g., some components on the same die as the memory, and some components on a different die, module, or board) as a distributed controller.

Controller 208 can communicate with memory devices 210-1, 210-2, . . . , 210-N to sense (e.g., read), program (e.g., write), and/or erase information, among other operations. Controller 208 can have circuitry that may be a number of integrated circuits and/or discrete components. In a number of embodiments, the circuitry in controller 208 may include control circuitry for controlling access across memory devices 210-1, 210-2, . . . , 210-N and/or circuitry for providing a translation layer (e.g., a flash translation layer) between host 202 and memory system 204.

Controller 208 can control operation of a dedicated region, such as a block addressing portion, of each respective memory device 210-1, 210-2, . . . , 210-N as (e.g., configure a portion of each respective memory devices 210-1, 210-2, . . . , 210-N to operate as) a static (e.g., dedicated) single level cell (SLC) cache and/or a dynamic SLC cache. For example, a portion of each respective memory device 210-1, 210-2, . . . , 210-N can be configured to operate as a static cache in SLC mode and/or a dynamic cache in SLC mode. This portion of each respective memory device 210-1, 210-2, . . . , 210-N can be, for example, a first plurality of blocks (e.g., physical blocks) of memory cells in each respective memory and may be referred to herein as a first portion of the memory. In addition, portions of each respective memory device 210-1, 210-2, . . . , 210-N can include a second plurality of blocks, a third plurality of blocks, etc.

As used herein, MLC memory (e.g., MLCs) can refer to memory (e.g. memory cells) that can be programmed to a targeted one of more than two data states (e.g., memory cells that can store more than a single bit of data). For example, MLC memory can refer to memory cells that store two bits of data per cell, memory cells that store three bits of data per cell (e.g., TLCs), and/or memory cells that store four bits of data per cell (e.g., QLCs).

In some embodiments, the static SLC blocks are never programmed in MLC mode. For example, in some embodiments, SLC endurance of the static SLC blocks may be increased without regard to MLC wear ratio. Accordingly, mixed mode blocks may be used interchangeably in the SLC mode or the MLC mode. In some embodiments, when using a mixed mode block in the SLC mode, MLC wear ratio may be increased without regard to SLC endurance. In some embodiments, a high SLC endurance without regard to MLC wear ratio may be achieved for static SLC blocks, while a low SLC endurance combined with high MLC ratio may be achieved for mixed mode blocks. The low SLC endurance combined with a high MLC wear ratio may be achieved for mixed mode blocks using a single SLC trim set. In some embodiments, a mixed mode block erased in MLC mode can be used to program in SLC mode, and a mixed mode block erased in SLC mode may not be used to program in MLC mode.

In some embodiments, the controller 208 may be configured to determine that a particular memory block associated with a memory block among the plurality of memory blocks is to be written in a single level cell (SLC) mode, and erase data stored in the particular memory block in the SLC mode in response to the determination that the particular memory block is to be written in the SLC mode. The particular memory block may be a host memory block and/or may have been written in an MLC mode prior to the determination that the particular block is to be written in the SLC mode.

In some embodiments, the controller 208 may be configured to increment an SLC erase counter for the particular memory block in response to the data stored in the particular block being erased in the SLC mode. In at least one embodiment, at least one memory block among the plurality of memory blocks may be erased during idle time of the apparatus 204.

The controller 208 may be configured to write data to the particular memory block in the SLC mode after the data stored in the particular memory block is erased in the SLC mode. The controller 208 may be configured to determine a free block count for memory blocks among the plurality of memory blocks. In some embodiments, foreground garbage collection may be invoked in response to the free block count being reduced to below a threshold number of free blocks.

The embodiment illustrated in FIG. 2 can include additional circuitry, logic, and/or components not illustrated so as not to obscure embodiments of the present disclosure. For example, memory device 204 can include address circuitry to latch address signals provided over I/O connectors through I/O circuitry. Address signals can be received and decoded by a row decoders and column decoders, to access memories 210-1, 210-2, . . . , 210-N.

Figure 3:
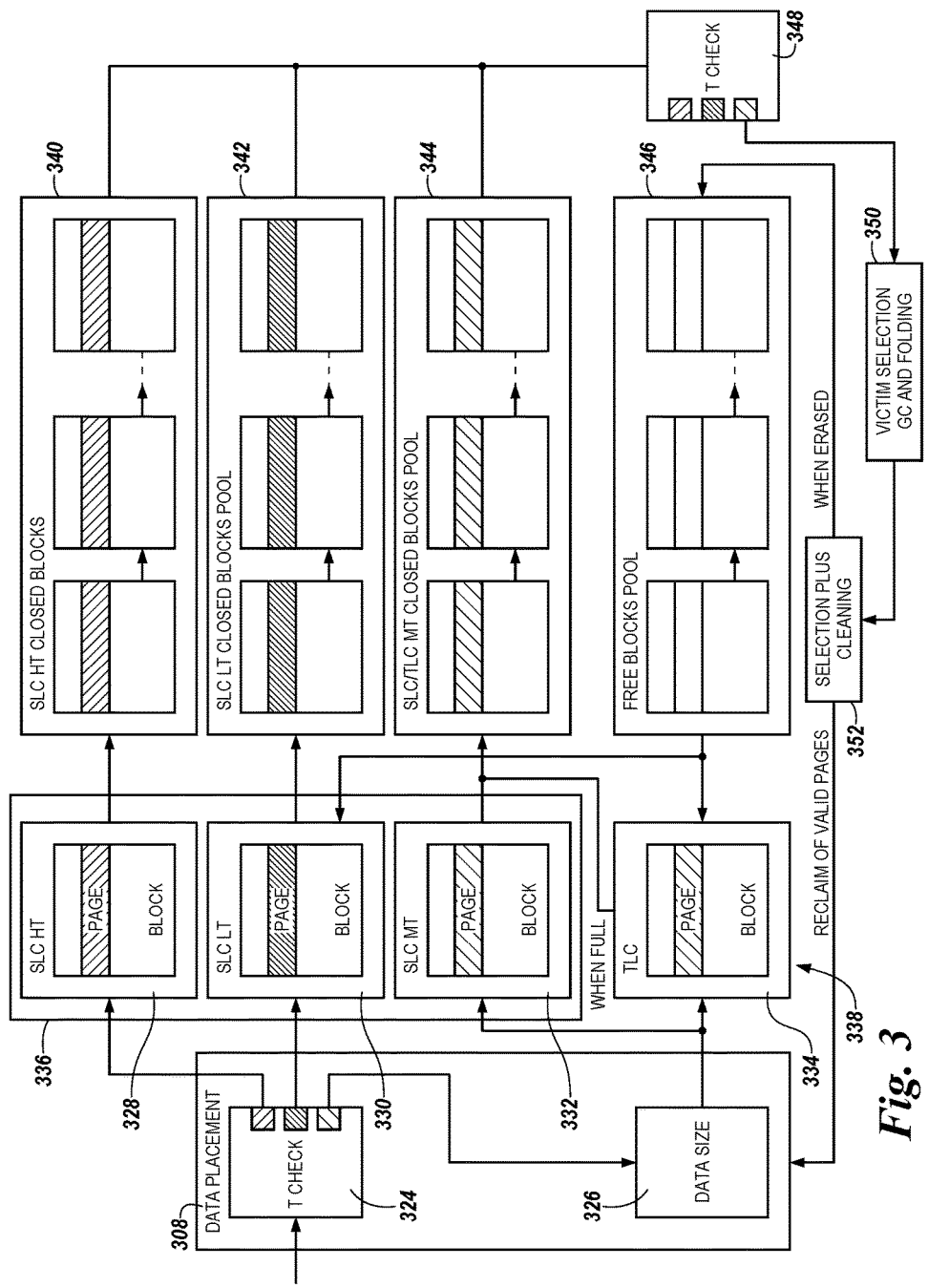
FIG. 3 is a functional block diagram associated with temperature-based memory operations in accordance with one or more embodiments of the present disclosure.

FIG. 3 is a functional block diagram associated with temperature-based memory operations in accordance with one or more embodiments of the present disclosure. A controller 308 can receive a write request and perform a temperature check to determine an operating temperature of the apparatus at 324. The temperature check can be performed using a temperature sensor (e.g., an embedded temperature sensor), though other manners of determining temperature are in accordance with embodiments herein. The temperature can be determined via a command issued by the controller 308 to the embedded temperature sensor, which may be updated in near real time.

The temperature check can allow the determination of a predetermined range into which the operating temperature (sometimes referred to herein simply as "temperature") falls. As previously discussed, and as indicated in FIG. 3, three temperature ranges can be determined. It is again noted, however, that embodiments herein are not so limited. A first temperature range ("low T" or simply "LT") can correspond to temperatures or a temperature range below a first temperature threshold. The first temperature threshold is not limited to a particular value, but for purposes of discussion is herein given the value of 0 degrees Celsius. In some embodiments, for instance, the first temperature range is between −40 and 0 degrees Celsius. A second temperature range ("high T" or simply "HT") can correspond to temperatures or a temperature range above a second temperature threshold. The second temperature threshold is not limited to a particular value, but for purposes of discussion is herein given the value of 70 degrees Celsius. In some embodiments, for instance, the second temperature range is between 70 and 125 degrees Celsius. A third temperature range ("mid T" or simply "MT") can correspond to temperatures between the first temperature threshold and the second temperature threshold. For purposes of discussion the third temperature range is given between 0 and 70 degrees Celsius. The temperature ranges and/or the temperature thresholds can be determined based on a target operating temperature of a vehicle (e.g., an automobile). For instance, the temperature ranges can be determined based on an amount of time the vehicle is expected to undergo temperatures falling within each range. It is noted that while the context of vehicles may be referred to herein, embodiments of the present disclosure are not so limited; such reference is made for purposes of discussion and/or example and is not to be taken in a limiting sense.

A number of embodiments provide that ranges of temperatures can have different intervals. For example, the range of temperatures from −40 degrees Celsius to 0 degrees Celsius has an interval of 40 degrees Celsius; the range of temperatures between 0 degrees Celsius and 70 degrees Celsius has an interval of 70 degrees Celsius; and the range of temperatures between 70 and 125 degrees Celsius has an interval of 55 degrees Celsius. These intervals are provided for illustrative purposes and are not to be taken in a limiting sense. In some embodiments, one or more of the intervals may be the same.

A number of embodiments can define a plurality of open blocks designated for data written in different temperature ranges. As shown in FIG. 3, the open blocks can include open blocks of a first type 336. In some embodiments the first type 336 of block can be an SLC type. The open blocks can include open blocks of a second type 338. In some embodiments the second type 338 of block can be an MLC type.

Included in the first type 336 is an LT block 330 corresponding to the first temperature range, an HT block 328 corresponding to the second temperature range, and a MT block 332 corresponding to the third temperature range. Included in the second type 338 is an MLC block also corresponding to the third temperature range.

The controller 308 can write data in the LT block 330 responsive to a determination that the operating temperature is below the first temperature threshold (e.g., 0 degrees Celsius) or within the first temperature range (e.g., −40 degrees Celsius to 0 degrees Celsius). The controller 308 can write data in the HT block 328 responsive to a determination that the operating temperature is above the second temperature threshold (e.g., 70 degrees Celsius) or within the second temperature range (e.g., 70 degrees Celsius to 125 degrees Celsius).

When the operating temperature is between the first and second temperature thresholds (within the third temperature range), the controller may determine a size of the data at 326. In some embodiments, determining a size of the data may refer to determining whether the data is below or above a size threshold. If the data is below the size threshold, the controller 308 writes the data in the MT block 332. If the data is above the size threshold, the controller 308 writes the data in the MLC block 334. Thus, in a number of embodiments, data may only be written as MLC data when the temperature is moderate and when the data is of sufficient size, otherwise it is written as SLC data.

In a number of embodiments, data is not tagged with temperature information. Stated differently, each individual data item may not be tagged with temperature indicators. By placing the data into the appropriate designated open block, embodiments herein can avoid the added steps of later determining the conditions under which the data was written. Accordingly, tracking the plurality of different temperature ranges on a per-block basis can allow embodiments herein to know the temperature range at which data was written without storing an indicator along with the written data.

When the HT block 328 is full (e.g., completely written), it can be closed and may be pooled with other closed HT blocks at 340. When the LT block 330 is full, it can be closed and pooled with other closed LT blocks at 342. When the MT block 332 is full, it can be closed and pooled with other closed MT blocks at 344. When the MLC block 334 is full, it can be closed and pooled with other closed MT blocks at 344. Accordingly, separate closed block pools can be maintained and/or organized by designated temperature ranges.

In a number of embodiments, when either high temperatures or low temperatures return to medium temperatures (e.g., between 0 and 70 degrees Celsius), SLC data can be folded and/or flushed into free MLC blocks and the SLC blocks can be cleaned. In order to determine that the temperature is returned to within the middle range (e.g., the third temperature range), the controller 308 can perform another temperature check at 348. If so, victim block selection for garbage collection and folding can be performed as indicated at 350.

Garbage collection in accordance with one or more embodiments herein can include selecting victim blocks based on the number of valid pages of blocks in the HT closed block pool 340, the LT closed block pool 342, and the MT closed block pool 344. Whichever pool includes blocks with a number of valid pages below a valid page threshold may be selected as the victim. In some embodiments, whichever pool includes blocks with the smallest number of valid pages may be selected as the victim.

In a number of embodiments, garbage collection can include selecting victim blocks based on current operating temperature. While embodiments herein may perform garbage collection in the middle temperature range only, it is to be anticipated that the current operating temperature may be closer to one of the temperature thresholds than the other. If, for example, the current operating temperature is 65 degrees Celsius (approximately 5 degrees Celsius below the second threshold), blocks from the HT closed block pool 340 may be prioritized for garbage collection operations. Similarly, if, for example, if the current operating temperature is 5 degrees Celsius (approximately 5 degrees Celsius above the first threshold), blocks from the LT closed block pool 342 may be prioritized for garbage collection operations.

At 352, folding and garbage collection has been performed on the closed blocks, and the blocks are cleaned. Valid pages can be reclaimed and written to free MLC blocks at 334, and cleaned blocks can be placed in a pool of free blocks 346. Each of the free blocks 346 can be tagged and/or designated by the controller 308 as an HT open block 328, an LT open block 330, an MT open block 332, or an MLC open block 324. Stated differently, the controller 308 can tag a free block with a designation that it is now deemed one of the HT open block 328, the LT open block 330, the MT open block 332, and the MLC open block 324.

When a read request is later received (e.g., at a second time instance), embodiments of the present disclosure can read from the blocks described herein. For instance, a read request received at a low temperature (e.g., −12 degrees Celsius) targeting data written at a high temperature (e.g., 88 degrees Celsius) can take place on HT blocks or on TLC blocks. A read request received at a high temperature (e.g., 100 degrees Celsius) targeting data written at a low temperature (e.g., −20 degrees Celsius) can take place on LT blocks or on TLC blocks. A severe cross-temperature scenario, such as a read request received at −40 degrees Celsius targeting data written at 125 degrees Celsius, may only be allowed on SLC (not MLC) blocks, in some embodiments.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device; and
   a controller coupled to the memory device and configured to:
   determine an operating temperature of the apparatus;
   determine one of a plurality of designated open blocks of the memory device to write data based on the operating temperature of the apparatus, wherein the plurality of designated open blocks includes:
   a first block corresponding to a first operating temperature range below a first temperature threshold;
   a second block corresponding to a second operating temperature range above a second temperature threshold;
   a third block corresponding to a third operating temperature range above the first temperature threshold and below the second temperature threshold; and
   a fourth block corresponding to the third operating temperature range; and
   write the data in the determined one of the plurality of designated blocks of the memory device.

2. The apparatus of claim 1, wherein the controller is configured to determine the one of the plurality of designated open blocks of the memory device to write data based on the operating temperature of the apparatus and a size of the data.

3. The apparatus of claim 1, wherein the controller is configured to determine the third block to write the data responsive to a size of the data being below a size threshold.

4. The apparatus of claim 3, wherein the controller is configured to determine the fourth block to write the data responsive to a size of the data being above the size threshold.

5. The apparatus of claim 1, wherein the first and second temperature thresholds are determined based on a target operating temperature of a vehicle.

6. The apparatus of claim 1, wherein the first temperature threshold is 0 degrees Celsius and the second temperature threshold is 70 degrees Celsius.

7. The apparatus of claim 1, wherein the memory device comprises non-volatile memory.

8. The apparatus of claim 1, wherein the memory device comprises NAND flash memory.

9. The apparatus of claim 1, wherein the apparatus is part of an electronic system within a vehicle.

10. A method for temperature-based memory operations, comprising:
    receiving a request to write data to a memory apparatus comprising memory cells operable as single level cells (SLCs) and as multiple level cells (MLCs);
    determining a temperature associated with the memory apparatus; and
    selecting one of a plurality of open blocks on which to perform a write operation based on the determined temperature; and
    wherein the selected one of the plurality of open blocks is selected from among a maintained plurality of open blocks that includes a plurality of open blocks designated as SLC blocks and corresponding to a respective plurality of different temperature ranges.

11. The method of claim 10, wherein the plurality of open blocks also includes an open block designated as an MLC block.

12. The method of claim 10, wherein the method includes tracking the plurality of different temperature ranges on a per-block basis such that a temperature range at which data is written is known without storing an indicator along with the written data.

13. The method of claim 10, wherein the method includes determining that one of the plurality of open blocks has become closed; and
    replacing the closed block with a block from a free block pool.

14. The method of claim 10, wherein the method includes maintaining separate closed block pools organized by designated temperature ranges.

15. A method for providing temperature-based memory operations, comprising:
    determining a first operating temperature of a memory device of a vehicle at a first time instance;
    writing data in one of a plurality of designated open blocks of the memory device responsive to a write request based on the operating temperature of the memory device and a size of the data, wherein the plurality of blocks includes:
    a first block of a first block type corresponding to a first operating temperature range below a first temperature threshold;
    a second block of the first block type corresponding to a second operating temperature range above a second temperature threshold;
    a third block of the first block type corresponding to a third operating temperature range above the first temperature threshold and below the second temperature threshold and corresponding to data size below a data size threshold; and
    a fourth block of a second block type corresponding to the third operating temperature range and corresponding to data size above a data size threshold;
    determining a second operating temperature of the memory device of the vehicle at a second time instance; and
    folding data from closed blocks of the first block type to at least one free block of the second block type responsive to a determination that the second operating temperature is within the third operating temperature range.

16. The method of claim 15, wherein the first block type is a single-level cell block type, and wherein the second block type is a multi-level cell block type.

17. The method of claim 15, wherein the method includes performing garbage collection on closed blocks of the first block type responsive to the determination that the second operating temperature is within the third operating temperature range.

18. The method of claim 15, wherein the method includes determining the operating temperature using an embedded temperature sensor.

19. The method of claim 15, wherein the method includes not folding data from closed blocks of the first block type to at least one free block of the second block type and not performing garbage collection on closed blocks of the first block type responsive to a determination that the second operating temperature is not within the third operating temperature range.

20. A controller, comprising:
circuitry configured to:
- determine an operating temperature of a memory device of a vehicle at a first time instance;
- communicate with a plurality of designated open blocks of the memory device, wherein the plurality of designated blocks includes:
  - a first block corresponding to a first operating temperature range below a first temperature threshold;
  - a second block corresponding to a second operating temperature range above a second temperature threshold;
  - a third block corresponding to a third operating temperature range above the first temperature threshold and below the second temperature threshold; and
  - a fourth block corresponding to the third operating temperature range;
- write data in the first block responsive to a determination that the operating temperature at the first time instance is below the first temperature threshold;
- write data in the second block responsive to a determination that the operating temperature at the first time instance is above the second temperature threshold;
- write data in the third block responsive to:
  - a determination that the operating temperature at the first time instance is above the first temperature threshold and below the second temperature threshold; and
  - a determination that a size of the data is below a size threshold; and
- write the data in the fourth block responsive to:
  - the determination that the operating temperature at the first time instance is above the first temperature threshold and below the second temperature threshold; and
  - a determination that the size of the data is above the size threshold.

21. The controller of claim 20, wherein the first, second, and third blocks comprise single level cell blocks, and wherein the fourth block comprises a multi-level cell block.

22. The controller of claim 20, wherein the controller is a portion of one of: an infotainment system of the vehicle, an instrument cluster system of the vehicle, and a black box data recording system of the vehicle.

23. The controller of claim 20, wherein the controller is configured to:
- tag a free block with a designation indicating that the free block is one of: the first block, the second block, the third block, and the fourth block.

* * * * *